(12) United States Patent
Shibata et al.

(10) Patent No.: US 6,767,807 B2
(45) Date of Patent: Jul. 27, 2004

(54) METHOD FOR PRODUCING ORGANIC THIN FILM DEVICE AND TRANSFER MATERIAL USED THEREIN

(75) Inventors: Takeshi Shibata, Kanagawa-ken (JP); Yasushi Araki, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/084,933

(22) Filed: Mar. 1, 2002

(65) Prior Publication Data

US 2002/0127877 A1 Sep. 12, 2002

(30) Foreign Application Priority Data

Mar. 2, 2001 (JP) .................................. 2001-058834
Mar. 2, 2001 (JP) .................................. 2001-058835

(51) Int. Cl.[7] .............................................. H01L 21/31
(52) U.S. Cl. .................. 438/496; 438/623; 438/693; 438/781
(58) Field of Search ................................ 438/496, 623, 438/693, 780, 781, FOR 385

(56) References Cited

U.S. PATENT DOCUMENTS

| 4,356,429 A | * | 10/1982 | Tang .......................... 313/503 |
| 4,446,399 A | * | 5/1984 | Endo et al. .................. 313/505 |
| 4,539,507 A | * | 9/1985 | VanSlyke et al. ............ 313/504 |
| 4,999,539 A | * | 3/1991 | Coovert et al. .............. 313/505 |
| 5,061,569 A | * | 10/1991 | VanSlyke et al. ............ 428/457 |
| 5,073,446 A | * | 12/1991 | Scozzafava et al. .......... 428/323 |
| 5,151,629 A | * | 9/1992 | VanSlyke ..................... 313/504 |
| 6,246,070 B1 | * | 6/2001 | Yamazaki et al. ............ 257/40 |
| 6,440,877 B1 | * | 8/2002 | Yamazaki et al. ............ 438/780 |
| 2002/0064966 A1 | * | 5/2002 | Seki et al. ................... 438/780 |

FOREIGN PATENT DOCUMENTS

WO      WO 00/41893 A1     7/2000

* cited by examiner

*Primary Examiner*—George Foursch
*Assistant Examiner*—Joannie Adelle Garcia
(74) *Attorney, Agent, or Firm*—Sughrue Mion, PLLC

(57) ABSTRACT

A transfer material comprising an organic thin film uniformly provided by a wet method, etc. with high productivity is used to efficiently produce an organic thin film device such as an organic EL device excellent in light-emitting efficiency, uniformity of light emission and durability. A method for producing the organic thin film device according to the present invention comprises the steps of: making an organic thin film 112 of a transfer material 110 face a transparent electrically conductive layer 102 disposed on a support 101, the transfer material 110 having the organic thin film 112 on a temporally substrate 111; decompressing a space 105 between the transfer material 110 and the transparent electrically conductive layer 102 to bring the transfer material 110 in contact to the transparent electrically conductive layer 102; heating at least one organic thin film 112; and peeling the temporary substrate 111 from the organic thin film 112 to transfer the organic thin film 112 to the transparent electrically conductive layer 102.

59 Claims, 7 Drawing Sheets

METHOD FOR PRODUCING ORGANIC THIN FILM DEVICE AND TRANSFER MATERIAL USED THEREIN

FIELD OF THE INVENTION

The present invention relates to a method for producing an organic thin film device and a transfer material usable for the method, particularly to a method of providing an organic thin film of an organic EL device (organic electroluminescent device).

BACKGROUND OF THE INVENTION

Recently, much attention has been paid to organic light-emitting devices such as organic EL devices that can be easily applied to a surface light-emitting device. Specifically, the organic light-emitting device has been considered to be useful as an economical, solid emission type, light-emitting device having a large emission area such as a full color display device and a writing light source array, thereby having been actively studied. The organic light-emitting device generally comprises a couple of electrodes, a transparent electrode and a back side electrode, and a light-emitting organic thin film disposed between the electrodes. When to the organic light-emitting device is applied an electric field, electrons are injected from the back side electrode and holes are injected from the transparent electrode to the light-emitting organic thin film. The electrons and the holes are re-combined in the light-emitting organic thin film and energy is converted into light while an energy level is turned from a conduction band to a valence band, whereby the organic light-emitting device emits light.

The organic thin film in the organic light-emitting device has been generally provided by a vapor deposition process. Patterning methods for the organic thin film have been proposed in view of development of color image emission. For example, U.S. Pat. No. 5,294,869 disclosed a patterning method using a shadow mask. However, this patterning method needs a complicated vapor deposition apparatus to be poor in productivity and positional accuracy of patterning.

To overcome the above problems in patterning, Japanese Patent Laid-Open No. 9-167684 disclosed a method where an organic thin film is uniformly provided on a mica temporary substrate by a vapor deposition process beforehand, and the organic thin film is disposed closer to a substrate and selectively vapor-deposited onto the substrate in a pattern. Further, Japanese Patent Laid-Open No. 2000-195665 disclosed a method where an organic thin film is uniformly provided on a film temporary substrate by a vapor deposition process beforehand, and the organic thin film is disposed closer to a substrate through a mask and vapor-deposited onto the substrate in a pattern of the mask. These methods using the vapor deposition source provided on the temporary substrate are disadvantageous in that the vapor deposition process is poor in productivity and that only a low molecular weight organic compound can be used for the organic thin film.

Polymer-type organic light-emitting devices using a light-emitting organic thin film made of a polymer or a low molecular weight organic compound dispersed in a binder resin also have been known. Examples of the polymer include poly(p-phenylenevinylene) for green light emission (Nature, Vol. 347, Page 539, 1990), poly(3-alkylthiophene) for red-orange light emission (Japanese Journal of Applied Physics, Vol. 30, Page L1938, 1991), polyalkylfluorene blue light emission (Japanese Journal of Applied Physics, Vol. 30, Page L1941, 1991), etc. Such polymer-type organic light-emitting devices can be easily increased in emitting area to be useful for a flexible device. However, the light-emitting organic thin film cannot be provided by a vapor deposition process, whereby the light-emitting organic thin film is generally provided by a wet method.

As a method for providing a patterned, light-emitting organic thin film of the polymer-type organic light-emitting device, an ink-jet method, a printing method, etc. have been proposed. However, the patterned, light-emitting organic thin film provided by such a method is insufficient in uniformity of thickness because of a surface tension of a solution used in the method. Further, in the case of providing a laminate of a plurality of organic thin films, components is dissolved and mixed around a boundary of each film. Thus, the polymer-type organic light-emitting device utilizing the patterning method is poor in light-emitting efficiency and durability.

Expectations are high for a plastic film of a high molecular weight material as a flexible substrate of the organic light-emitting device. However, the plastic film is poor in oxygen- and water-resistance to be far from practicable, so that the substrate is generally made of a glass. The glass substrate is more difficult in handling than the plastic film, thereby reducing productivity in wet method. Further, in the case of using the plastic film substrate, the transparent electrode and a thin film transistor are laminated on the substrate to be costly. Coating such a substrate with the organic thin film is disadvantageous in yield and economical efficiency. Thus, there has been increasing need for a patterning method usable for production of the polymer-type organic light-emitting device.

WO 00/41893 disclosed a method using a donor sheet comprising an organic thin film and a photo-thermal conversion layer, where the organic thin film is thermally transferred to the substrate in a desired pattern by a laser. Such a thermal transfer method is disadvantageous in that a gas often penetrates into an interface between the organic thin film and the substrate. In the organic light-emitting device produced by this method, light-emitting efficiency, durability and uniformity of a light-emitting surface depend on conditions of the interface, and light-emitting properties are worsened by the penetration of a gas.

Further, in thermal writing-patterning method using a thermal head or a laser that is utilized in printing technique, temperature distribution expands around the pattern due to thermal diffusivity so that outlines of the organic thin film cannot be formed accurately. Thus, organic light-emitting devices produced by this method vary in amount of emission and has a defect due to an electric inferiority or a break of the organic thin film to be poor in durability. Further, there is a case where yield is lowered by poor positional accuracy of the substrate and the thermal head or the laser.

OBJECT AND SUMMARY OF THE INVENTION

An object of the present invention is to provide a method where an organic thin film is uniformly provided by a wet method, etc., so that an organic thin film device such as an organic EL device excellent in light-emitting efficiency, uniformity of light emission and durability is efficiently produced with a simple apparatus and reduced cost. Another object of the present invention is to provide a transfer material usable in the method.

As a result of intense research in view of the above objects, the inventors have found that an organic thin film device such as an organic EL device excellent in light-emitting efficiency, uniformity of light emission and durability can be produced with excellent efficiency and reduced cost by a method where an organic thin film is provided on a temporary substrate by a wet method, etc. and transferred to a substrate. The present invention has been accomplished by the finding.

Thus, the first method for producing an organic thin film device according to the present invention comprises the steps of: making an organic thin film of a transfer material face a substrate, the transfer material having the organic thin film on a temporally substrate; decompressing a space between the transfer material and the substrate to bring the transfer material in contact to the substrate; heating at least one organic thin film; and peeling the temporary substrate from the organic thin film to transfer the organic thin film to the substrate.

In the first method, the organic thin film may be transferred to the substrate in a minute pattern by the steps of: placing a mask having a plurality of openings in the minute pattern between the transfer material and the substrate; decompressing spaces in the openings between the transfer material and the substrate to bring the transfer material in contact to the substrate; heating at least one organic thin film; and peeling the temporary substrate from the organic thin film. Each of the openings of the mask is preferably tapered from the transfer material side to the substrate side. It is preferred that the mask has an aperture connected with the openings and the spaces are decompressed through the aperture. Further, the aperture preferably comprises recesses provided on the bottom of the mask. The mask is preferably made of a material selected from the group consisting of metals, glasses, ceramics and heat resistant resins.

The second method according to the present invention is for producing an organic thin film device where a laminate of a plurality of continuous or patterned organic thin films is provided on a substrate by repeating a peeling-transfer process. The peeling-transfer process comprises the steps of: making an organic thin film of a transfer material face the substrate, the transfer material having the organic thin film on a temporally substrate; bringing the transfer material in contact to the substrate; heating at least one organic thin film; and peeling the temporary substrate from the organic thin film to transfer the organic thin film to the substrate. In the second method, it is preferred that the transfer material is brought in contact to the substrate while decompressing a space between the transfer material and the substrate.

In the first and second methods according to the present invention, each of a blue light-emitting organic thin film, a green light-emitting organic thin film and a red light-emitting organic thin film may be transferred to the substrate in a minute pattern to provide a light-emitting organic thin film comprising pixels of blue, green and red arranged repeatedly. The organic thin film is preferably heated at 40 to 200° C. Further, it is preferred that the organic thin film is provided on the temporally substrate by a wet method.

The third method for producing an organic thin film device according to the present invention comprises the steps of: making a light-emitting organic thin film comprising patterned pixels of blue, green and red of a transfer material face a substrate, the transfer material having the light-emitting organic thin film on a temporally substrate; bringing the transfer material in contact to the substrate; heating at least one light-emitting organic thin film; and peeling the temporary substrate from the light-emitting organic thin film to transfer the light-emitting organic thin film to the substrate. In the third method, it is preferred that the transfer material is brought in contact to the substrate while decompressing a space between the transfer material and the substrate. The light-emitting organic thin film is preferably heated at 40 to 200° C. Further, it is preferred that the light-emitting organic thin film is provided on the temporally substrate by a wet method.

A transfer material of the present invention comprises a temporary substrate and a light-emitting organic thin film provided on the temporary substrate by a wet method, etc., the light-emitting organic thin film comprising patterned pixels of blue, green and red. The transfer material of the present invention can be used in the third method.

The organic thin film device produced by the first, second or third method preferably comprises a light-emitting organic thin film or a carrier-transporting organic thin film, more preferably comprises a hole-transporting organic thin film, a light emitting organic thin film and an electron-transporting organic thin film disposed in this order from the substrate side. Further, the light-emitting organic thin film preferably comprises pixels of blue, green and red arranged repeatedly. The substrate preferably comprises a support and a transparent electrically conductive layer disposed on the support.

DETAILED DESCRIPTION OF THE PREFERRED EMBODIMENTS

The first, second and third methods for producing an organic thin film device according to the present invention will be explained in detail below with reference to FIGS. 1 to 13, and the structure of the organic thin film device will be explained in detail below without intention of restricting the scope of the present invention defined by the claims attached hereto.

[1] Method for Producing Organic Thin Film Device (1) First Method

Figure 1A:
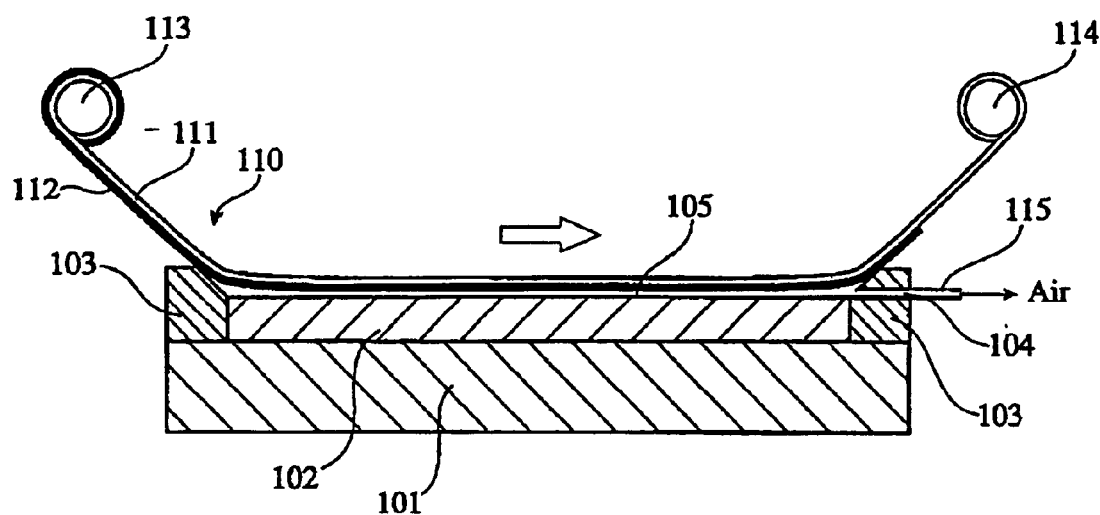
FIG. 1(a) is a schematic, cross-sectional view showing an embodiment of the first method according to the present invention.
Figure 1B:
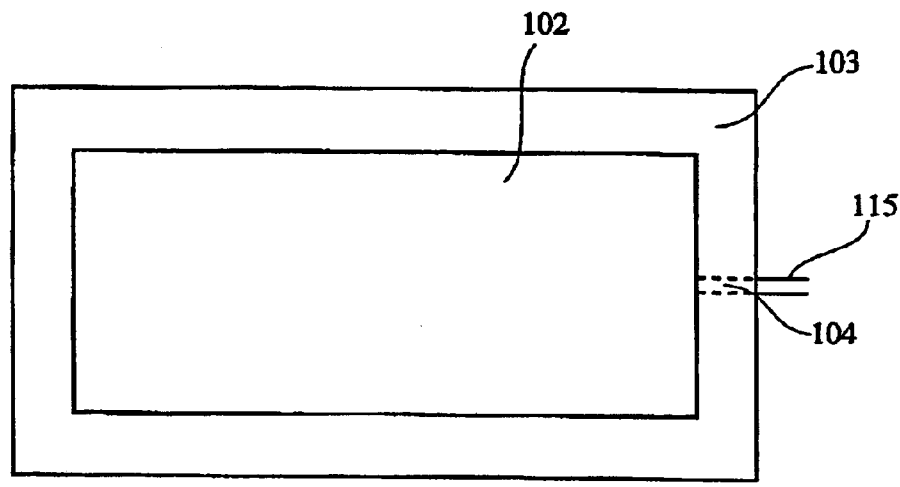
FIG. 1(b) is a top view showing the embodiment of FIG. 1(a)
Figure 2:
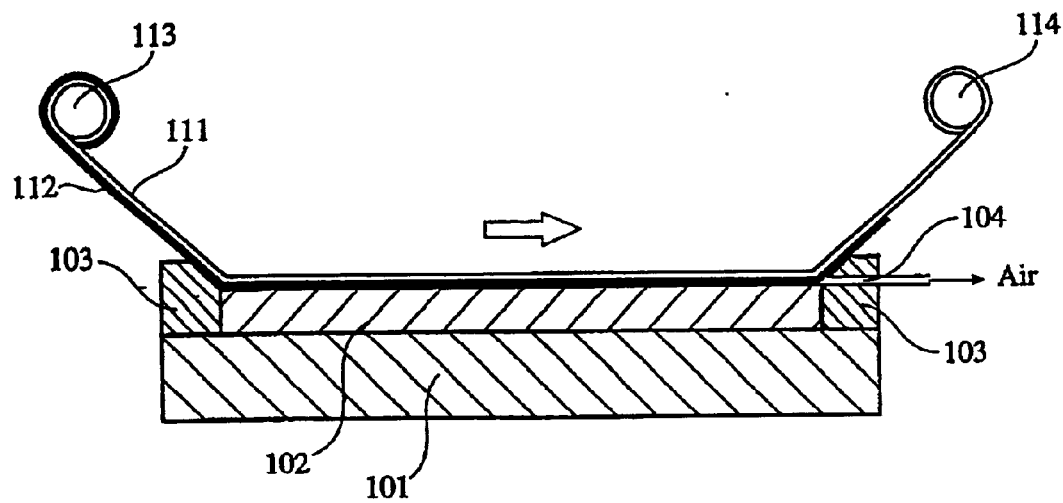
FIG. 2 is a schematic, cross-sectional view showing a process of decompressing a space between a substrate and a transfer material of FIG. 1(a)
Figure 3:
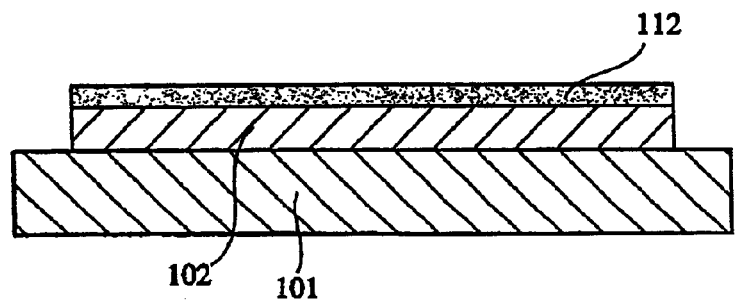
FIG. 3 is a schematic, cross-sectional view showing an organic thin film transferred to the substrate of FIG. 1(a)

FIGS. 1(a), 1(b), 2 and 3 show an embodiment of the first method according to the present invention. On a support 101 is disposed a transparent electrically conductive layer 102 and a mask 103 such that the transparent electrically conductive layer 102 is enclosed by the mask 103. The mask 103 comprises an aperture 104 connecting to a space 105 between the transparent electrically conductive layer 102 and a transfer material 110. The aperture 104 is connected to a vacuum apparatus (not shown) through a pipe 115. The transfer material 110 comprises a temporary substrate 111 and an organic thin film 112 provided on a surface of the temporary substrate 111. The transfer material 110 wound on a roll 113 is rewound by a roll 114 such that the transfer material 110 is moved while coming in contact with the mask 103. Thus, the transfer material 110, the mask 103 and the transparent electrically conductive layer 102 form the closed space 105 (FIGS. 1(a) and 1(b)). When the vacuum apparatus is operated in the state where the transfer material 110 comes in contact with the mask 103, the space 105 is decompressed so that the transfer material 110 is brought in tight contact to the transparent electrically conductive layer 102 as shown in FIG. 2. Then, the organic thin film 112 of the transfer material 110 is heated by a thermal head, etc., to be bond to the transparent electrically conductive layer 102. The temporary substrate 111 is peeled off from the organic thin film 112 and the mask 103 is removed to produce an organic thin film device where the continuous, organic thin film 112 is provided on the transparent electrically conductive layer 102 as shown in FIG. 3.

Figure 4:
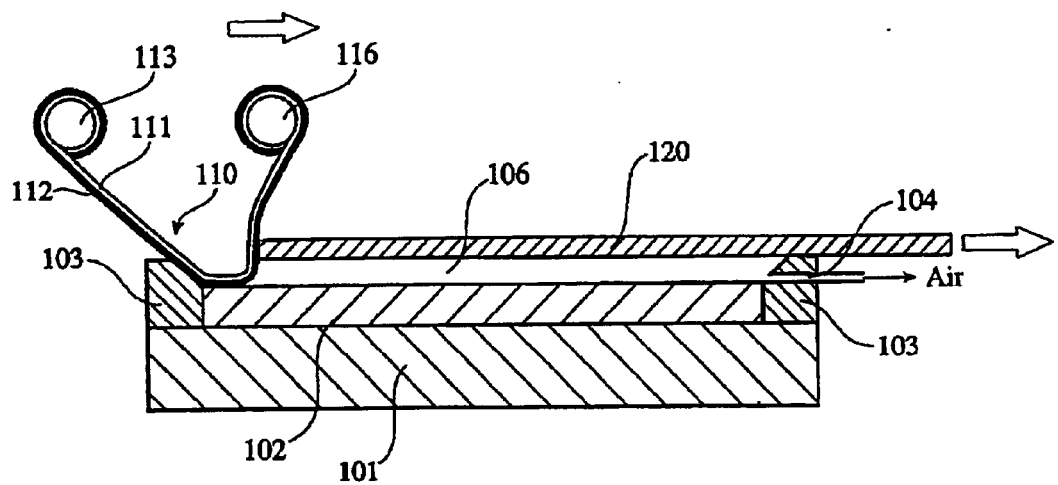
FIG. 4 is a schematic, cross-sectional view showing another embodiment of the first method according to the present invention.

FIG. 4 is a schematic, cross-sectional view showing another embodiment of the first method according to the present invention. A plate 120 moves with a roll 116 while coming in contact with the mask 103. A space 106 enclosed by the transparent electrically conductive layer 102 disposed on the support 101, the mask 103, the plate 120 and the transfer material 110 connects to the aperture 104 in the mask 103. Thus, the organic thin film 112 of the transfer material 110 is brought in tight contact to the transparent electrically conductive layer 102 by decompressing the space 106. Then, the organic thin film 112 is heated and the temporary substrate 111 is peeled off as above to produce an organic thin film device where the continuous, organic thin film 112 is provided on the transparent electrically conductive layer 102. In this method, because only a small area of the transfer material 110 comes into contact with the transparent electrically conductive layer 102, there is little fear of air remaining between the organic thin film 112 and the transparent electrically conductive layer 102.

Figure 5A:
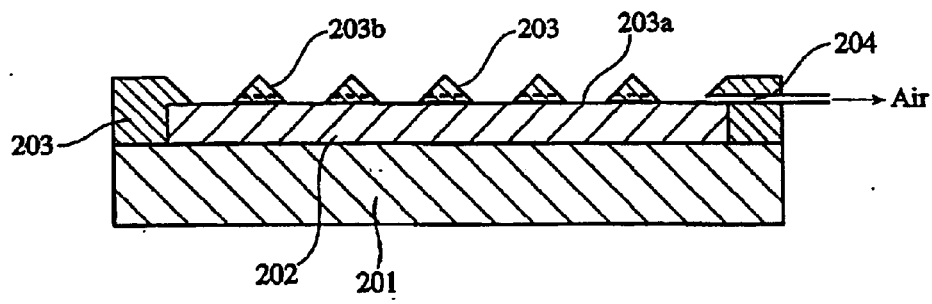
FIG. 5(a) is a schematic, cross-sectional view showing a mask used in a further embodiment of the first method according to the present invention.
Figure 5B:
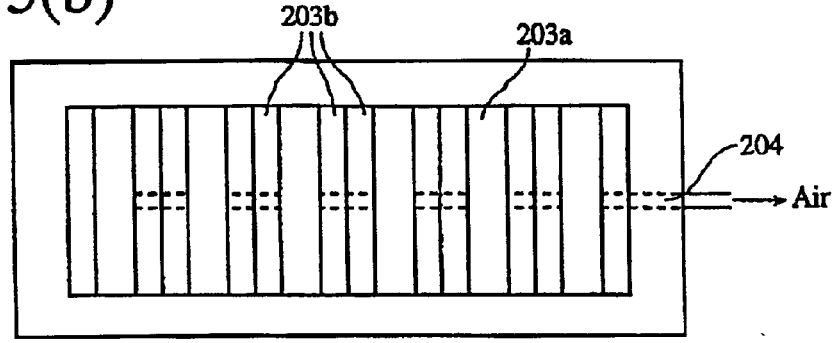
FIG. 5(b) is a top view showing the mask of FIG. 5(a)
Figure 6A:
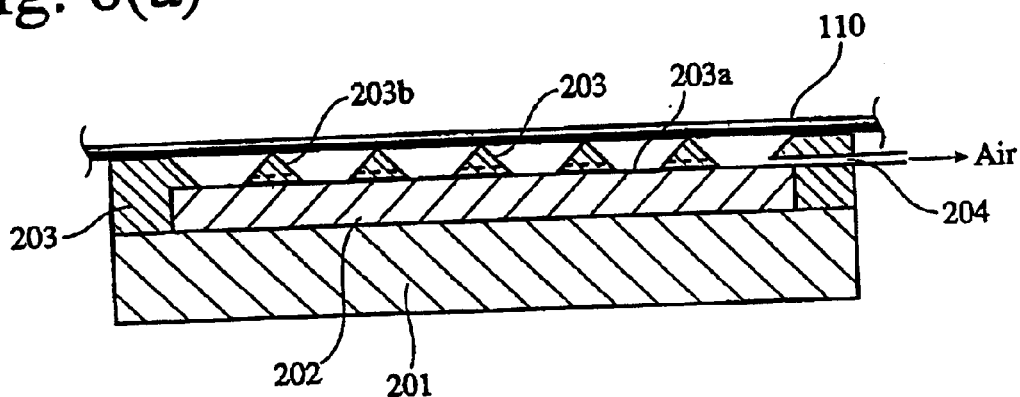
FIG. 6(a) is a schematic, cross-sectional view showing a transfer material disposed on the mask of FIG. 5(a)
Figure 6B:
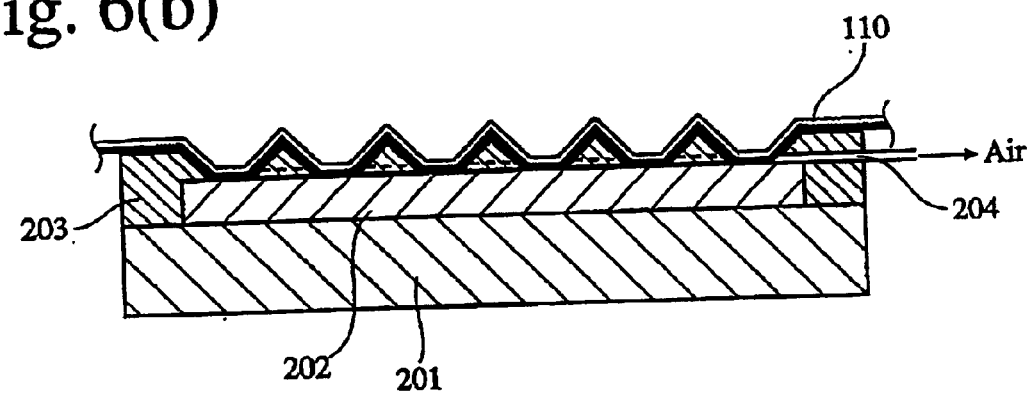
FIG. 6(b) is a schematic, cross-sectional view showing a process of decompressing spaces between a substrate and the transfer material of FIG. 6(a)
Figure 7:
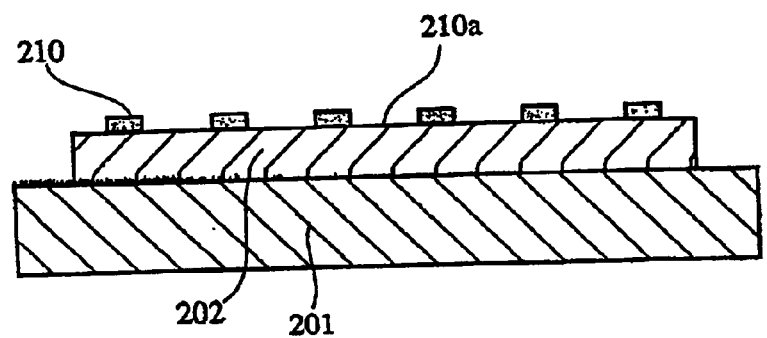
FIG. 7 is a schematic, cross-sectional view showing an organic thin film transferred to the substrate of FIG. 6(a)

FIGS. 5(a), 5(b), 6(a), 6(b) and 7 are a view showing a further embodiment of the first method according to the present invention, respectively. First, a mask 203 having openings 203a in a minute pattern is brought in tight contact to a substrate, which comprises a support 201 of a glass, etc. and a transparent electrically conductive layer 202 disposed thereon. As shown in FIGS. 5(a) and 5(b), each opening 203a of the mask 203 may be tapered from the transfer material side to the substrate side. Thus, each opening 203a may have tapered portions 203b. The openings 203a communicates to an external vacuum apparatus through an aperture 204 formed on the back surface of the mask 203. Then, the transfer material 110 is disposed on the upper portion of the mask 203, whereby spaces are formed by the transparent electrically conductive layer 202, the transfer material 110 and the mask 203 (FIG. 6(a)). The spaces in the openings 203a are decompressed through the aperture 204 by the vacuum apparatus, thus, the transfer material 110 is formed into a shape corresponding to the tapered openings 203a, whereby the transfer material 110 comes into tight contact with the transparent electrically conductive layer 202 only at the openings 203a (FIG. 6(b)). After heating the transfer material 110 and the transparent electrically conductive layer 202, the temporary substrate of the transfer material 110 is peeled off, so that an organic thin film 210 is transferred to the transparent electrically conductive layer 202 in the minute pattern correspondingly to the openings 203a (FIG. 7). Transfer of the organic thin film in portions 210a is prevented by the mask 203.

Figure 8:
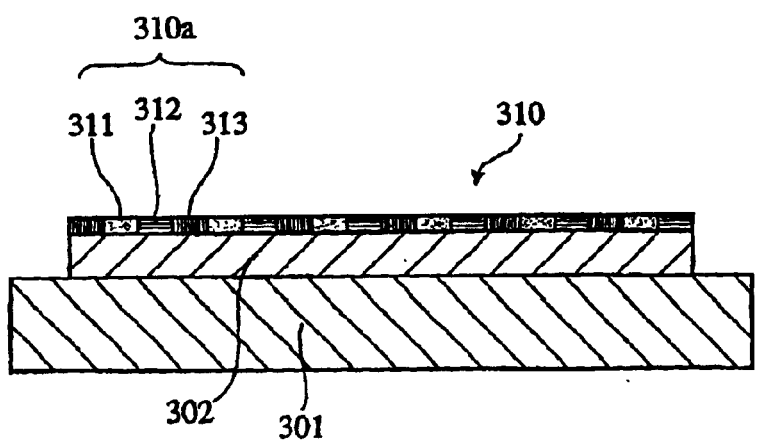
FIG. 8 is a schematic, cross-sectional view showing an example of the organic thin film device produced by the first method according to the present invention.
Figure 9:
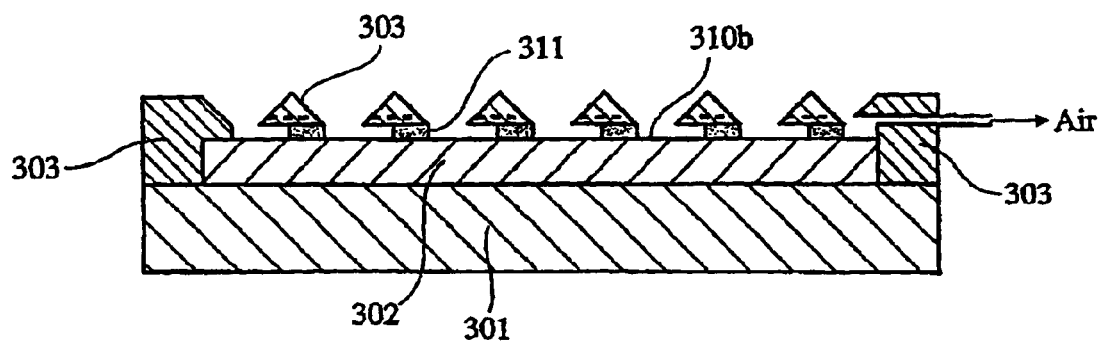
FIG. 9 is a schematic, cross-sectional view showing production of the organic thin film device of FIG. 8.

A multi-color light-emitting organic thin film 310 shown in FIG. 8 may be provided by the above-mentioned mask having the openings in the minute pattern. The multi-color light-emitting organic thin film 310 comprises a plurality of light-emitting units 310a composed of a blue pixel 311, a green pixel 312 and a red pixel 313. The light-emitting units 310a are on the whole surface of the multi-color light-emitting organic thin film 310 uniformly. The blue pixels 311 are provided on a transparent electrically conductive layer 302 disposed on a support 301 as above, then, a mask 303 is set in the predetermined position such that half of a non-transferred region 310b is covered with the mask 303 as shown in FIG. 9. Then, a green light-emitting organic thin film is transferred to the half of the non-transferred region 310b to provide the green pixels 312 by the same steps as described for FIGS. 6(a) and 6(b) of: placing a transfer material comprising a temporary substrate and a green light-emitting organic thin film on the mask 303; decompressing and heating; and peeling off the temporary substrate. Equally, the red pixels 313 are provided by the steps of: setting the mask 303 in the predetermined position such that remaining half of the non-transferred region 310b is covered with the mask 303; placing a transfer material comprising a temporary substrate and a red light-emitting organic thin film on the mask 303; decompressing and heating; and peeling off the temporary substrate.

(2) Second Method

Figure 10:
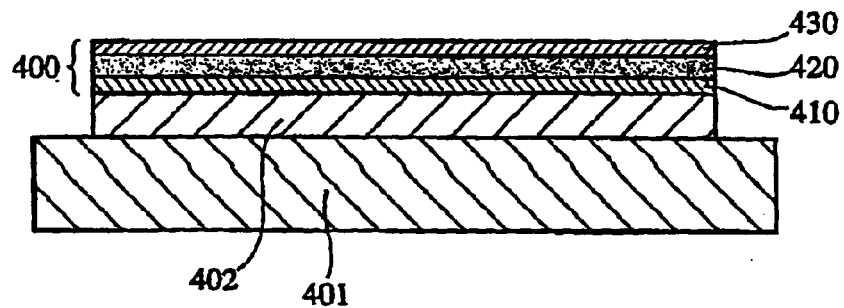
FIG. 10 is a schematic, cross-sectional view showing an example of the organic thin film device produced by the second method according to the present invention.

FIG. 10 is a schematic, cross-sectional view showing an example of the organic thin film device produced by the second method according to the present invention. In FIG. 10, an organic thin film 400 is provided on a transparent electrically conductive layer 402 disposed on a support 401, the organic thin film 400 comprising a hole-transporting organic thin film 410, a light-emitting organic thin film 420 and an electron-transporting organic thin film 430. Each of the organic thin films 410, 420 and 430 are provided by the above-mentioned peeling-transfer process in order, to form the organic thin film 400. Specifically, the hole-transporting organic thin film 410 is provided on a surface of a temporary substrate to prepare a first transfer material, and the first transfer material is moved while coming into contact with a mask in the same manner as described for FIG. 1. Then, a space enclosed by the first transfer material, the mask and the transparent electrically conductive layer 402 is decompressed so that the first transfer material is brought in tight contact to the transparent electrically conductive layer 402. The hole-transporting organic thin film 410 of the first transfer material is heated, the temporary substrate is peeled off from the hole-transporting organic thin film 410 and the mask is removed, to transfer the hole-transporting organic thin film 410 to the transparent electrically conductive layer 402 into a continuous surface shape. Next, the light-emitting organic thin film 420 is provided on a surface of the other temporary substrate to prepare a second transfer material, and the second transfer material is disposed on the hole-transporting organic thin film 410 in contact with a mask. A space enclosed by the second transfer material, the mask and the hole-transporting organic thin film 410 is decompressed so that the second transfer material is brought into tight contact to the hole-transporting organic thin film 410. The light-emitting organic thin film 420 of the second transfer material is heated, the temporary substrate is peeled off from the light-emitting organic thin film 420 and the mask is removed, to transfer the light-emitting organic thin film 420 to the hole-transporting organic thin film 410 into a continuous surface shape. Equally, the electron-transporting organic thin film 430 is provided on a temporary substrate to prepare a third transfer material and transferred onto the is light-emitting organic thin film 420.

Figure 11:
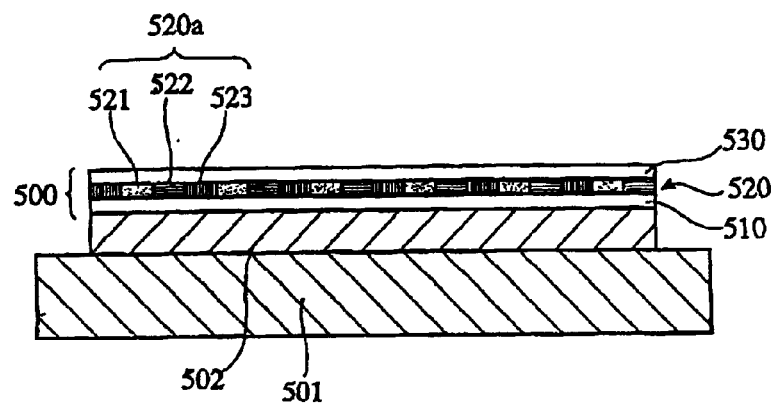
FIG. 11 is a schematic, cross-sectional view showing another example of the organic thin film device produced by the second method according to the present invention.

FIG. 11 is a schematic, cross-sectional view showing another example of the organic thin film device produced by the second method according to the present invention. In FIG. 11, an organic thin film 500 is provided on a transparent electrically conductive layer 502 disposed on a support 501, the organic thin film 500 comprising a hole-transporting organic thin film 510, a light-emitting organic thin film 520 and an electron-transporting organic thin film 530. The light-emitting organic thin film 520 comprises a plurality of light-emitting units 520a composed of a blue pixel 321, a green pixel 522 and a red pixel 523. The light-emitting units 520a are disposed on the whole surface of the light-emitting organic thin film 520 uniformly. The hole-transporting organic thin film 510 is transferred to the transparent electrically conductive layer 502 in the same manner as described for FIG. 10, and then, the multi-color light-emitting organic thin film 520 is transferred onto the hole-transporting organic thin film 510 in the same manner as the multi-color light-emitting organic thin film 310 shown in FIG. 8. Finally, the electron-transporting organic thin film 530 is transferred onto the light-emitting organic thin film 520 in the same manner as described for FIG. 10.

(3) Third Method

Figure 12A:
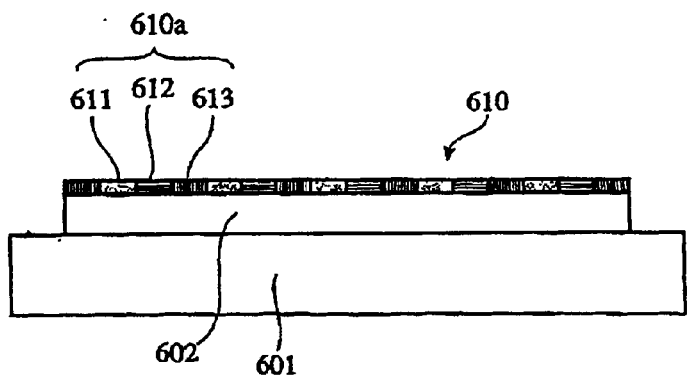
FIG. 12(a) is a schematic, cross-sectional view showing an example of the organic thin film device produced by the third method according to the present invention.
Figure 12B:
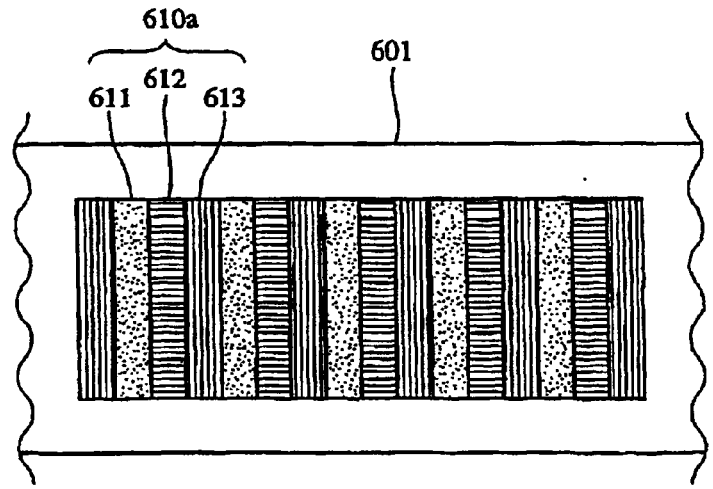
FIG. 12(b) is a top view showing the organic thin film device of FIG. 12(a)

A transfer material used in the third method of the present invention comprises a temporary substrate and a light-emitting organic thin film provided thereon by a wet method, etc., the light-emitting organic thin film comprising pixels of blue, green and red, which are formed in a predetermined pattern, respectively. FIGS. 12(a) and 12(b) are a view showing an example of the organic thin film device produced by the third method, respectively. The light-emitting organic thin film 610 shown in FIGS. 12(a) and 12(b) comprises a plurality of light-emitting units 610a composed of a blue pixel 611, a green pixel 612 and a red pixel 613. The light-emitting units 610a are disposed on the whole surface of a transparent electrically conductive layer 602 provided on a support 601 uniformly. Each of the pixels 611, 612 and 613 may be formed in a stripe pattern as shown in FIG. 12(b), or in a two-dimensional grid pattern, etc.

In the third method, the other organic thin film may be provided in combination with the patterned, light-emitting organic thin film to form a laminate on a substrate. A method for providing the other organic thin film is not particularly limited. The substrate may be coated with the other organic thin film by a wet method. A transfer material comprising a temporary substrate and the uniform other organic thin film may be prepared to transfer the other organic thin film to the substrate by a peeling-transfer process. Further, the other organic thin film may be provided on the patterned, light-emitting organic thin film by a wet method to prepare a transfer material comprising a temporary substrate and a multi-layer organic thin film, then, the multi-layer organic thin film may be transferred to the substrate. Furthermore, the laminate of the patterned, light-emitting organic thin film and the other organic thin film may be provided on the substrate by repeating the peeling-transfer process in the same manner as the second method mentioned above. In the case where the light-emitting organic thin film and the other organic thin film have similar solvent-solubility, such laminate is preferably formed by repetition of the peeling-transfer process. Examples of the organic thin film device comprising such laminate will be described with reference to FIGS. 13(a), 13(b), 13(c) and 13(d) without intention of restricting the scope of the present invention defined by the claims attached hereto.

Figure 13A:
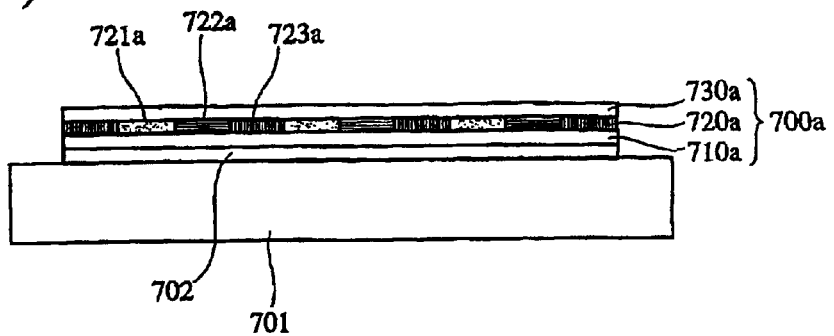
FIGS. 13(a), 13(b), 13(c) and 13(d) are a schematic, cross-sectional view showing a further example of the organic thin film device produced by the third method according to the present invention, respectively.

In FIG. 13(a), a laminate 700a is provided on a transparent electrically conductive layer 702 disposed on a support 701. The laminate 700a comprises a hole-transporting organic thin film 710a, a light-emitting organic thin film 720a and an electron-transporting organic thin film 730a. The light-emitting organic thin film 720a comprises pixels of blue, green and red 721a, 722a and 723a. Each of the organic thin films 710a, 720a and 730a is formed by the peeling-transfer process using the temporary substrate. Specifically, the hole-transporting organic thin film 710a is provided on a temporary substrate to prepare a first transfer material, and the hole-transporting organic thin film 710a is transferred onto the transparent electrically conductive layer 702 by the peeling-transfer process using the first transfer material. Then, the light-emitting organic thin film 720a is provided on a temporary substrate to prepare a second transfer material, and the light-emitting organic thin film 720a is transferred onto the hole-transporting organic thin film 710a by the peeling-transfer process using the second transfer material. Finally, the electron-transporting organic thin film 730a is provided on a temporary substrate to prepare a third transfer material, and the electron-transporting organic thin film 730a is transferred onto the light-emitting organic thin film 720a by the peeling-transfer process using the third transfer material.

Figure 13B:
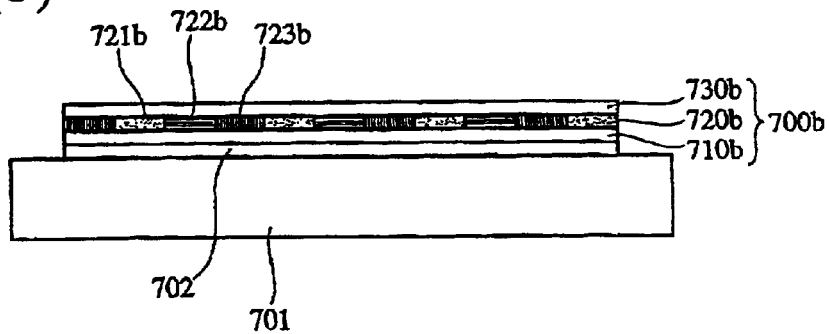
Figure 13C:
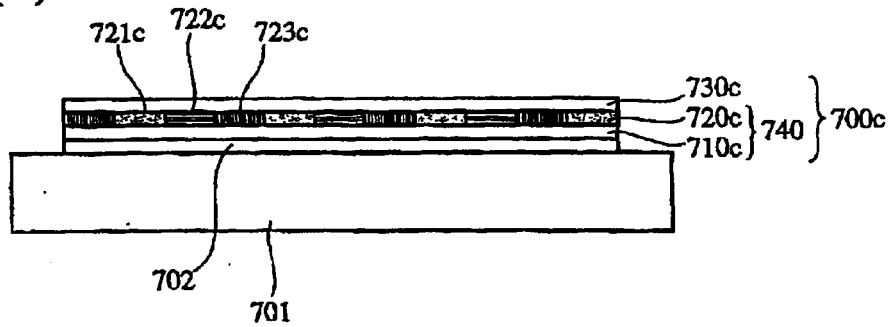

In FIG. 13(b), a laminate 700b is provided on the transparent electrically conductive layer 702 disposed on the support 701. The laminate 700b comprises a hole-transporting organic thin film 710b, a light-emitting organic thin film 720b and an electron-transporting organic thin film 730b. The light-emitting organic thin film 720b comprises pixels of blue, green and red 721b, 722b and 723b. Though the structure of the laminate 700b is the same as that of the laminate 700a, they differ from each other in forming method. In the laminate 700b, only the light-emitting organic thin film 720b is formed by the peeling-transfer process, and the hole-transporting organic thin film 710b and the electron-transporting organic thin film 730b are formed by a wet-type coating method. Specifically, the hole-transporting organic thin film 710b is provided on the transparent electrically conductive layer 702 by the wet-type coating method, and then, the light-emitting organic thin film 720b is provided on a temporary substrate to prepare a transfer material and the light-emitting organic thin film 720b is transferred onto the hole-transporting organic thin film 710b by the peeling-transfer process using the transfer material. Finally, the electron-transporting organic thin film 730b is provided on the light-emitting organic thin film 720b by the wet-type coating method In FIG. 13(c), a laminate 700c is provided on the transparent electrically conductive layer 702 disposed on the support 701. The laminate 700c comprises a hole-transporting organic thin film 710c, a light-emitting organic thin film 720c and an electron-transporting organic thin film 730c. The light-emitting organic thin film 720c comprises pixels of blue, green and red 721c, 722c and 723c. Though the structure of the laminate 700c is the same as that of the laminate 700a, they differ from each other in forming method. In the laminate 700c, the hole-transporting organic thin film 710c and the light-emitting organic thin film 720c are formed by the peeling-transfer process using the temporary substrate at the same time, and the electron-transporting organic thin film 730c is formed by the wet-type coating method. Specifically, the hole-transporting organic thin film 710c is provided on the temporary substrate by a wet method, the light-emitting organic thin film 720c is provided on the hole-transporting organic thin film 710c to prepare a transfer material, and the a laminate 740 of the hole-transporting organic thin film 710c and the light-emitting organic thin film 720c is transferred onto the transparent electrically conductive layer 702 by the peeling-transfer process using the transfer material. Then, the electron-transporting organic thin film 730c is provided on the light-emitting organic thin film 720c by the wet-type coating method.

Figure 13D:
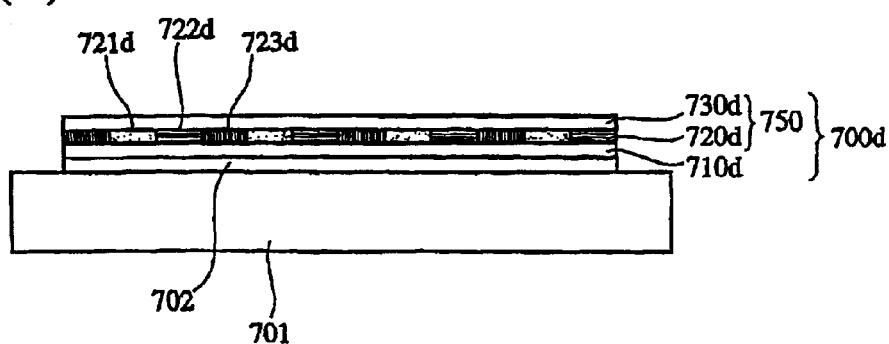

In FIG. 13(d), a laminate 700d is provided on the transparent electrically conductive layer 702 disposed on the support 701. The laminate 700d comprises a hole-transporting organic thin film 710d, a light-emitting organic thin film 720d and an electron-transporting organic thin film 730d. The light-emitting organic thin film 720d comprises pixels of blue, green and red 721d, 722d and 723d. Though the structure of the laminate 700d is the same as that of the laminate 700a, they differ from each other in forming method. In the laminate 700d, the hole-transporting organic thin film 710d is formed by the wet-type coating method, and the light-emitting organic thin film 720d and the electron-transporting organic thin film 730d are formed by the peeling-transfer process using the temporary substrate at the same time. Thus, the hole-transporting organic thin film 710d is provided on the transparent electrically conductive layer 302 by the wet-type coating method. Then, the light-emitting organic thin film 720d is provided on the temporary substrate, the electron-transporting organic thin film 730d is provided on the light-emitting organic thin film 720d by the wet method to prepare a transfer material, and the a laminate 750 of the light-emitting organic thin film 720d and the electron-transporting organic thin film 730d is transferred onto the hole-transporting organic thin film 710d by the peeling-transfer process using the transfer material.

(4) Transfer Material (a) Temporary Substrate

The temporary substrate used in the present invention is preferably made of a material that has chemical-stability, thermal-stability and flexibility. Preferred examples of the material include: fluorine resins such as a tetrafluoroethylene resin (PTFE), trifluororephthalate and polyethylene naphthalate (PEN); polyarylate; polycarbonate; polyolefin such as polyethylene and polypropylene; polyethersulfone (PES); etc. The temporary substrate is particularly preferably a thin sheet of such a material or a laminate thereof. The temporary substrate preferably has thickness of 1 to 300 $\mu$m. In the case of forming the organic thin film in a minute pattern, the thickness is particularly preferably 3 to 20 $\mu$m.

(b) Formation of Organic Thin Film on Temporary Substrate

The organic thin film comprising a high molecular weight compound as a binder is preferably provided on the temporary substrate by a wet method. For example, materials for the organic thin film are dissolved in an organic solvent at predetermined concentrations, and the temporary substrate is coated with thus-obtained solution to provide the organic thin film. Method of coating is not particularly limited if only it can form the organic thin film that has a thickness of 200 nm or less and uniform thickness distribution after drying. Examples of the method of coating include: spin coating methods; screen printing methods; gravure coating methods such as micro-gravure coating methods; dip coating methods; casting methods; die coating methods; roll coating methods; bar coating methods; extrusion coating methods; ink-jet coating methods; etc. The extrusion coating methods of roll-to-roll high in productivity are preferred in the first and second methods of the present invention, and the micro-gravure coating methods and the ink-jet coating methods are preferred for patterning in the third method of the present invention.

The light-emitting organic thin film comprising patterned pixels of blue, green and red used in the third method may be provided by applying coating solutions each containing a light-emitting compound for a color through a mask into a predetermined pattern in order. Material for the mask is not limited, and the mask is preferably made of such an economical material high in durability as a metal, a glass, a ceramic, a heat resistant resin, etc. A plurality of the materials may be used in combination with each other. Thickness of the mask is preferably 2 to 100 $\mu$m, more preferably 5 to 60 $\mu$m from the viewpoints of mechanical strength and accuracy in patterning of pixels.

(5) Laminate

In the case where the laminate of a plurality of the organic thin films is provided on the substrate, the temporary substrate may be stacked with the organic thin films to transfer the organic thin films to the substrate. The laminate may be provided by repeating the peeling-transfer process in order as described for the second method of the present invention. Further, a method other than the peeling-transfer process may be used in combination therewith. In the case where two organic thin films adjacent to each other have similar solvent-solubility, the laminate is preferably formed by repeating the peeling-transfer process.

(6) Peeling-Transfer Process

In the present invention, the organic thin film is formed by the peeling-transfer process. In the peeling-transfer process, the organic thin film is softened by heating and bond to the parent electrically conductive layer or the other organic thin film, and then, the temporary substrate is peeled off from the organic thin film to transfer and leave only the organic thin film thereonto. Heating may be achieved by means of a laminator, an infrared heater, a thermal head, etc. Specifically, "First Laminator VA-400" manufactured by TAISEI-LAMINATOR CO., a thermal head for thermal transfer printing, etc. may be used in this invention. Heating temperature is not particularly limited and may be selected depending on the material used for the organic thin film. In general, the heating temperature is preferably 40 to 200° C., particularly preferably 60 to 150° C.

(7) Mask

In the case of placing the mask between the transfer material and the substrate, material for the mask is not particularly limited, and preferably such an economical material with high durability as a metal, a glass, a ceramic, a heat resistant resin, etc. A plurality of the materials may be used in combination with each other. Thickness of the mask is preferably 2 to 100 µm, more preferably 5 to 60 µm from the viewpoints of mechanical strength and accuracy in transfer of the organic thin film.

In the above-described mask having the openings in a minute pattern, the openings are preferably tapered from the transfer material side to the substrate side such that the organic thin film of the transfer material is precisely bond to the transparent electrically conductive layer or the other organic thin film correspondingly to the shape of the openings. The tapered shape of the opening is not limited to that shown in FIG. 5(a).

(8) Substrate

As shown in FIG. 1(a), the substrate preferably comprises the support 111 and the transparent electrically conductive layer 102 disposed thereon. The support and the transparent electrically conductive layer will be described in detail later.

[2] Organic Thin Film Device

The organic thin film device according to the present invention may comprise such a lamination structure on the support as: transparent electrically conductive layer/light-emitting organic thin film/back side electrode; transparent electrically conductive layer/light-emitting organic thin film/electron-transporting organic thin film/back side electrode; transparent electrically conductive layer/hole-transporting organic thin film/light-emitting organic thin film/electron-transporting organic thin film/back side electrode; transparent electrically conductive layer/hole-transporting organic thin film/light-emitting organic thin film/back side electrode; transparent electrically conductive layer/light-emitting organic thin film/electron-transporting organic thin film/electron-injecting organic thin film/back side electrode; transparent electrically conductive layer/hole-injecting organic thin film/hole-transporting organic thin film/light-emitting organic thin film/electron-transporting organic thin film/electron-injecting organic thin film/back side electrode; the reversed structure thereof; etc. The light-emitting organic thin film comprises a light-emitting compound and light emission is generally allowed from the transparent electrically conductive layer side. Examples of materials for each organic thin film are described in "Organic EL Display" (Technotimes Co., Separate Volume of "Monthly Display", the October issue of 1998), etc.

(1) Substrate (a) Support

Examples of material used for the support include: inorganic materials such as yttrium-stabilized zirconia (YSZ) and glasses; polymer materials such as polyesters (polyethylene terephthalate, polybutylene terephthalate, polyethylene naphthalate, etc.), polystyrene, polycarbonates, polyethersulfones, polyarylates, allyldiglycolcarbonate, polyimides, polycycloolefins, norbornene resins, poly(chlorotrifluoroethylene), teflon and polytetrafluoroethylene-polyethylene copolymer, etc. The support may be made of one material or a plurality of materials. Among the materials, preferred are the polymer materials to produce a flexible organic thin film device and more preferred are such that is excellent in heat resistance, dimensional stability, solvent resistance, insulation property and workability and poor in gas permeability and hygroscopicity, for example, polyesters, polycarbonates, polyethersulfones, fluorine-containing polymer materials such as poly(chlorotrifluoroethylene), teflon and polytetrafluoroethylene-polyethylene copolymer.

Shape, structure and size of the support may be appropriately selected in accordance with purposes and applications of the organic thin film device. The support is generally in a plate-shape. The support may have a single-layer structure or a multi-layer structure. The support may be composed of one member or a plurality of members. The support may be colorless or colored, however, it is preferable that the support is colorless and transparent such that light emitted from the light-emitting organic thin film is not scattered or damped.

On one surface or the both surfaces of the support may be disposed a moisture permeation-inhibiting layer and/or a gas barrier layer. Such layers are preferably made of an inorganic compound such as silicon nitride, silicon oxide, etc. The moisture permeation-inhibiting layer and the gas barrier layer may be provided by a radio frequency sputtering method, etc. Further, a hard coating layer and an undercoating layer may be disposed on the support, if necessary.

(b) Transparent Electrically Conductive Layer (Transparent Electrode)

The transparent electrically conductive layer generally acts to supply positive holes to the organic thin films as a positive electrode. The transparent electrically conductive layer may act as a negative electrode, and in this case, the back side electrode acts as the positive electrode. The explanations will be made with respect to the case of using the transparent electrically conductive layer as the positive electrode.

Shape, structure and size of the transparent electrically conductive layer are not particularly limited and may be appropriately selected in accordance with applications and purposes of the organic thin film device. The transparent electrically conductive layer may be made of a metal, an alloy, a metal oxide, an electrically conductive compound, a mixture thereof etc. The transparent electrically conductive layer is preferably made of a material having a work function of 4 eV or more. Examples of the material for the transparent electrically conductive layer include: antimony-doped tin oxide (ATO); fluorine-doped tin oxide (FTO); semiconductive metal oxides such as tin oxide, zinc oxide, indium oxide, indium tin oxide (ITO) and indium zinc oxide (IZO); metals such as gold, silver, chromium and nickel; mixtures and laminations of the metal and a conductive metal oxide; inorganic conductive compounds such as copper iodide and copper sulfide; organic conductive compounds such as polyaniline, polythiophene and polypyrrole; laminations of the organic conductive compound and ITO; etc.

Method for forming the transparent electrically conductive layer is not particularly limited and may be appropriately selected depending on the material used therefor from: wet methods such as printing methods and coating methods; physical methods such as vacuum deposition methods, sputtering methods and ion-plating methods; chemical methods such as CVD methods and plasma CVD methods; etc. For example, the transparent electrically conductive layer of ITO is preferably disposed by a direct sputtering method, an RF sputtering method, a vapor deposition method, an ion-plating method, etc. The transparent electrically conductive layer of the organic conductive compound is preferably disposed by the wet method.

Patterning the transparent electrically conductive layer may be achieved by a chemical etching method such as a photolithography or a physical etching method using laser, etc. In addition, the transparent electrically conductive layer may be patterned by vacuum vapor deposition or sputtering while masking, a lift-off method, a printing method, etc.

Although the position of the transparent electrically conductive layer in the organic thin film device is not particularly limited and may be appropriately selected in accordance with applications and purposes of the organic thin film device, the parent electrically conductive layer is preferably disposed on the support. The transparent electrically conductive layer may be disposed on the whole surface or a part of the support.

Thickness of the transparent electrically conductive layer may be properly controlled depending on the material used therefor. The thickness is generally 10 nm to 50 μm, preferably 50 nm to 20 μm. The resistance of the transparent electrically conductive layer is preferably $10^3$ Ω/square or less, more preferably $10^2$ Ω/square or less. The transparent electrically conductive layer may be colorless or colored. Light transmittance of the transparent electrically conductive layer is preferably 60% or more, more preferably 70% or more to allow light emission from the transparent electrically conductive layer side. The light transmittance can be measured by a known method using a spectrophotometer.

Further, electrodes disclosed in "Tomei-Dodenmaku no Shintenkai (Development of the Transparent Electrically Conductive Film)" supervised by Yutaka Sawada, CMC, Ink., 1999, etc. maybe used as the transparent electrically conductive layer. Particularly in the case of using a plastic support poor in heat resistance, it is preferable that the transparent electrically conductive layer is made of ITO or IZO and formed at a low temperature of 150° C. or less.

(2) Back Side Electrode

The back side electrode generally acts to supply electrons to the organic thin films as the negative electrode. The back side electrode may act as the positive electrode, and in this case, the above transparent electrically conductive layer acts as the negative electrode. The explanations will be made with respect to the case of using the back side electrode as the negative electrode.

Shape, structure and size of the back side electrode are not particularly limited and may be appropriately selected in accordance with applications and purposes of the organic thin film device. The back side electrode may be made of a metal, an alloy, a metal oxide, an electrically conductive compound, a mixture thereof, etc. The back side electrode is preferably made of a material having a work function of 4.5 eV or less. Examples of the material used for the back side electrode include: alkali metals such as Li, Na, K and Cs; alkaline earth metals such as Mg and Ca; gold; silver; lead; aluminum; a sodium-potassium alloy, a lithium-aluminum alloy; a magnesium-silver alloy; indium; rare earth metals such as ytterbium; etc. Although the materials may be used singly, it is preferable that the back side electrode is made of a plurality of materials to improve both of stability and electron injection property. Among the materials, alkali metals and alkaline earth metals are preferred from the viewpoint of the electron injection property and aluminum-based materials are preferred from the viewpoint of the stability during storage. Used as the aluminum-based material are simple substance of aluminum, and alloys and mixtures comprising aluminum and 0.01 to 10 weight % of alkali metal or alkaline earth metal such as a lithium-aluminum alloy, a magnesium aluminum alloy, etc. The back side electrode may be made of a material disclosed in Japanese Patent Laid-Open Nos. 2-15595 and 5-121172, etc.

Method for forming the back side electrode is not particularly limited, and may be appropriately selected depending on the material used therefor from: wet methods such as printing methods and coating methods; physical methods such as vacuum deposition methods, sputtering methods and ion-plating methods; chemical methods such as a CVD method and a plasma CVD method; etc. In the case of using a plurality of materials for the back side electrode, the materials may be spattered simultaneously or in order.

Patterning the back side electrode may be achieved by a chemical etching method such as a photolithography or a physical etching method using laser, etc. In addition, the back side electrode may be patterned by vacuum vapor deposition or sputtering while masking, a lift-off method, a printing method, etc.

Although the position of the back side electrode in the organic thin film device is not limited and may be appropriately selected in accordance with applications and purposes of the organic thin film device, the back side electrode is preferably disposed on the organic thin films. The back side electrode may be disposed on the whole surface or a part of the organic thin films. Further, a dielectric layer may be disposed between the back side electrode and the organic layer. The dielectric layer may be made of a fluorinated alkali metal or an alkaline earth metal and may have a thickness of 0.1 to 5 nm The dielectric layer may be formed by a vacuum vapor deposition method, a spattering method, an ion-plating method, etc.

Thickness of the back side electrode may be properly controlled depending on the material used therefor. The thickness is generally 10 nm to 5 μm, preferably 50 nm to 1 μm. The back side electrode may be transparent or opaque. The transparent back side electrode may be a laminate composed of a thin layer of the above-mentioned material having a thickness of 1 to 10 nm and a transparent conductive layer of ITO, IZO, etc.

(3) Light-Emitting Organic Thin Film

The light-emitting organic thin film comprises at least one light-emitting compound. The light-emitting compound is not particularly limited and may be a fluorescent compound or a phosphorescent compound. The fluorescent compound and the phosphorescent compound may be used in combination. In the present invention, the phosphorescent compound is preferably used from the viewpoints of a light-emitting brightness and a light-emitting efficiency.

Examples of the fluorescent compound used in this invention include: benzoxazole derivatives; benzoimidazole derivatives; benzothiazole derivatives; styrylbenzene derivatives; polyphenyl derivatives; diphenylbutadiene derivatives; tetraphenylbutadiene derivatives; naphthalimido derivatives; coumarin derivatives; perylene derivatives; perynone derivatives; oxadiazole derivatives; aldazine derivatives; pyralidine derivatives; cyclopentadiene derivatives; bis(styryl)anthracene derivatives; quinacridon derivatives; pyrrolopyridine derivatives; thiadiazolopyridine derivatives; styrylamine derivatives; aromatic dimethylidine compounds; metal complexes such as 8-quinolinol metal complexes and derivatives thereof and rare-earth metal complexes; light-emitting polymer material such as polythiophene, polyphenylene, polyphenylenevinylene, polyphenylenevinylene and derivatives thereof; etc. The fluorescent compounds may be used singly or as a mixture in combination with each other.

The phosphorescent compound preferably utilizes triplet excitons for light emission. The phosphorescent compound is preferably an ortho-metallation complex or a porphyrin complex. The porphyrin complex is preferably a porphyrin-platinum complex. The phosphorescent compound may be used singly and a plurality of the phosphorescent compounds may be used in combination with each other.

The ortho-metallation complex used in the present invention may be such a compound that is described in: Akio Yamamoto, "Yukikinzoku-Kagaku, Kiso to Oyo (Metalorganic Chemistry, Foundation and Application)", Page 150 to 232, Shokabo Publishing Co., Ltd., (1982); H. Yersin, "Photochemistry and Photophysics of Coordination Compounds", Page 71 to 77 and 135 to 146, Springer-Verlag, Inc. (1987), etc. Although ligands of the ortho-metallation complex are not particularly limited, the ortho-metallation complex generally has a particular ligand. Preferred examples of the particular ligand include 2-phenylpyridine derivatives, 7,8-benzoquinoline derivatives, 2-(2-thienyl)pyridine derivatives, 2-(1-naphthyl)pyridine derivatives and 2-phenylquinoline derivatives. The derivatives may have a substituent. The ortho-metallation complex may have a ligand other than the particular ligand. A central metal atom of the ortho-metallation complex may be selected from transition metals. The central metal is preferably rhodium, platinum, gold, iridium, ruthenium or palladium. The organic thin film comprising such an ortho-metallation complex is excellent in the light-emitting brightness and the light-emitting efficiency. Complexes disclosed in Japanese Patent No. 2000-254171, Paragraphs 0152 to 0180 may be used as the ortho-metallation complex in the present invention.

The ortho-metallation complex used in the present invention may be synthesized by a known method disclosed in: Inorg. Chem., 30, 1685, 1991; Inorg. Chem., 27, 3464, 1988; Inorg. Chem., 33, 545, 1994; Inorg. Chim. Acta, 181, 1245, 1991; J. Organomet. Chem., 335, 293, 1987; J. Arm Chem. Soc., 107, 1431, 1985; etc.

A weight ratio of the light-emitting compound in the light-emitting organic thin film is not particularly limited. The weight ratio is preferably 0.1 to 70 weight %, more preferably 1 to 20 weight % based on the total weight of the light-emitting organic thin film. If the weight ratio is less than 0.1 weight % or more than 70 weight %, there is a case where the light-emitting compound cannot achieve sufficient effect.

The light-emitting organic thin film may comprise a host compound, a hole-transporting material, an electron-transporting material, an electrically inactive polymer binder, etc. if necessary.

The host compound acts to accelerate light emission of the light-emitting compound such that the host compound is excited and energy is transferred from the excited host compound to the light-emitting compound. Examples of the host compound include: carbazole derivatives; triazole derivatives; oxazole derivatives; oxadiazole derivatives; imidazole derivatives; polyarylalkane derivatives; pyrazoline derivatives; pyrazolone derivatives; phenylenediamine derivatives; arylamine derivatives; amino-substituted chalcone derivatives; styrylanthracene derivatives; fluorenone derivatives; hydrazone derivatives; stilbene derivatives; silazane derivatives; aromatic tertiary amine compounds; styrylamine compounds; aromatic dimethylidyne compounds; porphyrin compounds; anthraquinodimethane derivatives; anthrone derivatives; diphenylquinone derivatives; thiopyran dioxide derivatives; carbodimide derivatives; fluorenylidenemethane derivatives; distyrylpyrazine derivatives; anhydrides derived from a heterocyclic tetracarboxylic acid having a structure such as naphthaleneperylene; phthalocyanine derivatives; 8-quinolinol metal complexes and derivatives thereof; metallophthalocyanines; metal complexes containing a benzoxazole ligand or a benzothiazole ligand; polysilane compounds; poly(N-vinylcarbazole) derivatives; aniline copolymers; electrically conductive polymers and oligomers such as oligothiophenes and polythiophenes; polythiophene derivatives; polyphenylene derivatives; polyphenylenevinylene derivatives; polyfluorene derivatives; etc. The host compound may be used singly or in combination with other host compound.

The hole-transporting material are not particularly limited and may be a low molecular weight material or a high molecular weight material if it has any function of: injecting the holes provided from the positive electrode into the light-emitting organic thin film; transporting the holes; and blocking the electrons provided from the negative electrode. Examples of the hole-transporting material include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers, electrically conductive polymers and oligomers such as oligothiophenes and polythiophenes, polythiophene derivatives; polyphenylene derivatives; polyphenylenevinylene derivatives; polyfluorene derivatives; etc. The hole-transporting material may be used singly or in combination with other hole-transporting material.

The electron-transporting material are not particularly limited if only it has any function of: injecting the electrons provided from the negative electrode into the light-emitting organic thin film; transporting the electrons; and blocking the holes provided from the positive electrode. Examples of the electron-transporting material include: triazole derivatives; oxazole derivatives; oxadiazole derivatives; fluorenone derivatives; anthraquinodimethane derivatives; anthrone derivatives; diphenylquinone derivatives; thiopyran dioxide derivatives; carbodimide derivatives; fluorenylidenemethane derivatives; distyrylpyrazine derivatives; anhydrides derived from a heterocyclic tetracarboxylic acid having a structure such as naphthaleneperylene; phthalocyanine derivatives; 8-quinolinol metal complexes and derivatives thereof; metallophthalocyanines; metal complexes containing a benzoxazole ligand or a benzothiazole ligand; aniline copolymers; electrically conductive polymers and oligomers such as oligothiophenes and polythiophenes; polythiophene derivatives; polyphenylene derivatives; polyphenylenevinylene derivatives; polyfluorene derivatives; etc.

Examples of the electrically inactive polymer binder include: polyvinyl chloride; polycarbonates; polystyrene; poly(methyl methacylate); poly(butyl methacrylate); polyesters; polysulfones; polyphenylene oxide; polybutadiene; hydrocarbon resins; ketone resins; phenoxy resins; polyamides; ethylcellulose; poly(vinyl acetate); ABS resins; polyurethanes; melamine resins; unsaturated polyesters; alkyd resins; epoxy resins; silicone resins; polyvinylbutyral; polyvinylacetal; etc. The light-emitting organic thin film containing the polymer binder can be easily formed by the wet film-forming method with a large area.

Thickness of the light-emitting organic thin film is preferably 10 to 200 nm, more preferably 20 to 80 nm. The light-emitting organic thin film having the thickness of more than 200 nm often requires increased driving voltage. On the other hand, when the thickness is less than 10 nm, there is a case where the organic thin film device short-circuits.

(4) Hole-Transporting Organic Thin Film

The organic thin film device may comprise the hole-transporting organic thin film if necessary. The hole-transporting organic thin film may be composed of the above-mentioned hole-transporting material. The hole-transporting layer may further contain the polymer binder mentioned above. Thickness of the hole-transporting organic thin film is preferably 10 to 200 nm, more preferably 20 to 80 nm. The thickness of more than 200 nm often increases the driving voltage for the organic thin film device, and the thickness of less than 10 nm often results in short-circuit of the organic thin film device.

(5) Electron-Transporting Organic Thin Film

The organic thin film device, may comprise the electron-transporting organic thin film if necessary. The electron-transporting organic thin film may be composed of the above-mentioned electro-transporting material. The electron-transporting organic thin film may further contain the polymer binder mentioned above. Thickness of the electron-transporting organic thin film is preferably 10 to 200 nm, more preferably 20 to 80 nm. The thickness of more than 200 nm often increases the driving voltage for the organic thin film device, and the thickness of less than 10 nm often results in short-circuit of the organic thin film device.

(6) Others

The organic thin film device of the present invention may comprise the protective layer disclosed in Japanese Patent Laid-Open Nos. 7-85974, 7-192866, 8-22891, 10-275682 and 10-106746, etc. The protective layer is generally disposed on the uppermost surface of the organic thin film device. In the organic thin film device where the support, the transparent electrically conductive layer, the organic thin films and the back side electrode are disposed in this order, the uppermost surface is the outer surface of the back side electrode. Further, in the organic thin film device where the support, the back side electrode, the organic thin fins and the transparent electrically conductive layer are disposed in this order, the uppermost surface is the outer surface of the transparent electrically conductive layer. Shape, size and thickness of the protective layer are not particularly limited. The protective layer may be made of any material that can prevent a substance such as water and oxygen, which can degrade the function of the organic thin film device, from entering or penetrating into the device. Silicon oxide, silicon dioxide, germanium oxide, germanium dioxide, etc. may be used for the protective layer.

A method for forming the protective layer is not particularly limited and the protective layer may be formed by a vacuum deposition method, a sputtering method, an activated sputtering method, a molecular beam epitaxy method (UBE method), a cluster ion beam method, an ion-plating method, a plasma polymerization method, a plasma CVD method, a laser CVD method, a thermal CVD method, a coating method, etc.

It is preferred that a sealing layer is disposed in the organic thin film device to prevent invasion or permeation of water or oxygen into the device. Examples of a material for the sealing layer include: copolymers of tetrafluoroethylene and at least one comonomer; fluorine-containing copolymers having a cyclic structure in the main chain; polyethylene; polypropylene; poly(methyl methacrylate); polyimides; polyureas; polytetrafluoroethylene; polychlorotrifluoroethylene; polydichlorodifluoroethylene; copolymers of chlorotrifluoroethylene or dichlorodifluoroethylene and another copolymer; a moisture-absorbing substance having a water absorption of 1% or more; a moisture-resistant substance having a water absorption of 0.1% or less; metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal fluorides such as $MgF_2$, LiF, $AlF_3$ and $CaF_2$; liquid fluorinated carbons such as perfluoroalkanes, perfluoroamines and perfluoroethers; dispersions prepared by adding an adsorbent for adsorbing moisture or oxygen to the liquid fluorinated carbon; etc.

In the organic thin film device of the present invention, the one or more organic thin films may be sealed by sealing parts such as a sealing plate and a sealing vessel to shield the device from invasion or penetration of moisture, oxygen, etc. The sealing parts may be disposed only on the back side electrode side. Alternatively, the entire light-emitting structure may be covered with the sealing parts. Shape, size and thickness of the sealing parts are not particularly limited if only the sealing parts can seal and shield the organic thin films from the external air. The sealing parts may be made of a glass; a stainless steel; a metal such as aluminum; a plastic such as poly(chlorotrifluoroethylene), polyester and polycarbonate; a ceramic; etc.

A sealing agent or an adhesive may be used when the sealing parts are disposed on the light-emitting structure. In the case of covering the entire light-emitting structure with the sealing parts, portions of the sealing parts may be heat-welded with each other without the sealing agent. Used as the sealing agent may be an ultraviolet-hardening resin, a thermosetting resin, a two-part type hardening resin, etc. Among them, the ultraviolet-hardening resin is preferable.

Further, a water-absorbing agent or an inert liquid may be interposed between the light-emitting structure and the sealing parts. The water-absorbing agent is not particularly limited and may be barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, a molecular sieve, a zeolite, magnesium oxide, etc. The inert liquid is also not particularly limited and may be: paraffin; liquid paraffin; a fluorine-containing solvent such as perfluoroalkane, perfluoroamine and perfluorether; a chlorine-containing solvent; silicone oil; etc.

EXAMPLES

The present invention will be explained in further detail by the following examples without intention of restricting the scope of the present invention defined by the claims attached hereto.

Example 1

Polyvinylcarbazole with Mw of 63,000 manufactured by Aldrich Chemical Co. and an ortho-metallation complex of tris(2-phenylpyridine) iridium complex were dissolved in dichloroethane to prepare an application liquid. Weight ratio of polyvinylcarbazole:tris(2-phenylpyridine)iridium complex was 40:1 in the application liquid. The application liquid was applied to a temporary substrate of PET film having a thickness of 5 $\mu$m manufactured by TEIJIN LIMITED by means of a bar-coater and dried at room temperature, to prepare a first transfer material comprising the temporary substrate and a light-emitting organic thin film having a thickness of 40 nm.

Polyvinylbutylal with Mw of 50,000 manufactured by Aldrich Chemical Co. and a compound of the following formula were dissolved in 1-butanol to prepare an application liquid. Weight ratio of polyvinylbutylal: the compound of the following formula was 10:20 in the application liquid.

The application liquid was applied to a temporary substrate of PET film having a thickness of 5 μm manufactured by TEIJIN LIMITED by means of an extrusion coating apparatus and dried under a vacuum condition at 80° C. for 2 hours, to prepare a second transfer material comprising the temporary substrate and an electron-transporting organic thin film having a thickness of 60 nm.

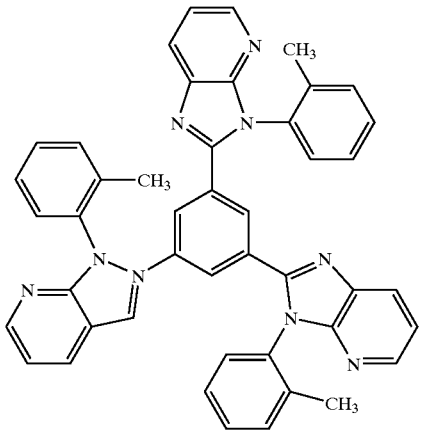

A support of a glass plate having a thickness of 0.5 mm and a size of 2.5 cm×2.5 cm was put into a vacuum chamber and thereon was formed an ITO transparent electrode by DC magnetron sputtering using an ITO target under a condition where a temperature of the support was 250° C. and an oxygen pressure was $1 \times 10^{-3}$ Pa. The ITO target had $SnO_2$-content of 10 weight % and a mole ratio of indium/tin was 95/5. The ITO transparent electrode had a thickness of 0.2 μm and a surface resistance of 10 Ω/square.

The support with the ITO transparent electrode was put into a washing vessel and washed with isopropyl alcohol (IPA), and then subjected to an oxygen plasma treatment. The ITO transparent electrode was spin-coated with poly (ethylenedioxythiophene)-polystyrene sulfonic acid aqueous dispersion is ("Baytron P" manufactured by BAYER AG., solid contents: 1.3%) and vacuum-dried at 150° C. for 2 hours to form a hole-transporting organic thin film having a thickness of 100 nm.

As shown in FIG. 2, the first transfer material was made to face the hole-transporting organic thin film, and brought in tight contact thereto under a vacuum condition. The resultant was heated from the first transfer material side by an infrared lamp at 110° C., and then, the temporary substrate was peeled off to transfer the light-emitting organic thin film onto the hole-transporting organic thin film.

The second transfer material was brought in tight contact to thus-formed light-emitting organic thin film under a vacuum condition as shown in FIG. 2. The resultant was heated from the second transfer material side by the infrared lamp at 110° C., and then, the temporary substrate was peeled off to transfer the electron-transporting organic thin film onto the light-emitting organic thin film.

Then, on the electron-transporting organic thin film was placed a mask patterned such that a light-emitting device has a light-emitting area of 5 mm×5 mm. The resultant was put into a vapor deposition apparatus, and a back side electrode was formed on the electron-transporting organic thin film by vapor depositing magnesium and silver with a mole ratio of magnesium/silver=10/1 into a thickness of 0.25 μm and by vapor depositing silver into a thickness of 0.3 μm. Aluminum lead wires were connected to the transparent electrode and the back side electrode to provide a light-emitting structure.

The resulting light-emitting structure was put into a glove box replaced with a nitrogen gas, and sealed with a sealing vessel of a glass by an ultraviolet-hardening adhesive "XNR5493" manufactured by Nagase-Chiba Co. to produce an organic EL device of Example 1.

Thus-obtained organic EL device of Example 1 was made to emit light while applying direct voltage thereto by "Source-Measure Unit 2400" manufactured by TOYO CORORATION. As a result, the organic EL device exhibited a light-emitting efficiency of 1% when it emits light with a brightness of 200 $cd/^2$, and the device exhibited a light-emitting efficiency of 3% when it emits light with a brightness of 2000 $cd/m^2$.

Example 2

Polyvinylcarbazole with Mw of 63,000 manufactured by Aldrich Chemical Co. and an ortho-metallation complex of tris(2-phenylpyridine) iridium complex were dissolved in dichloroethane to prepare an application liquid. Weight ratio of polyvinylcarbazole:tris(2-phenylpyridine)iridium complex was 40:1 in the application liquid. The application liquid was applied to the temporary substrate of PET film having a thickness of 5 μm manufactured by TEIJIN LIMITED by means of a microgravure coater and dried, to form a blue light-emitting organic thin film (blue pixels) having a thickness of 40 nm into a pattern with a width of 300 μm and a length of 600 μm.

Polyvinylcarbazole with Mw of 63,000 manufactured by Aldrich Chemical Co. and an ortho-metallation complex of tris(2-phenylpyridine)iridium complex were dissolved in dichloroethane to prepare an application liquid. Weight ratio of polyvinylcarbazole:tris(2-phenylpyridine)iridium complex was 40:1 in the application liquid. The application liquid was applied to the temporary substrate by means of the micro-gravure coater and dried, to form a green light-emitting organic thin film (green pixels) having a thickness of 40 nm into a pattern with a width of 300 μm and a length of 600 μm. Incidentally, the application liquid was applied to the half of the regions, on which the blue light-emitting organic thin film was not disposed.

Polyvinylcarbazole with Mw of 63,000 iridium manufactured by Aldrich Chemical Co. and an ortho-metallation complex of tris(2-phenylpyridine)iridium complex were dissolved in dichloroethane to prepare an application liquid. Weight ratio of polyvinylcarbazole:tris(2-phenylpyridine) iridium complex was 40:1 in the application liquid. The application liquid was applied to the temporary substrate by means of the micro-gravure coater and dried, to form a red light-emitting organic thin film (red pixels) having a thickness of 40 nm into a pattern with a width of 300 μm and a length of 600 μm. Incidentally, the application liquid was applied to the regions, on which the blue and green light-emitting organic thin films were not disposed.

Thus, a third transfer material comprising the temporary substrate and the pixels of blue, green and red provided on the temporary substrate in the pattern was prepared. An organic EL device of Example 2 as produced in the same manner as Example 1 except for using the third transfer material instead of the first transfer material.

The organic EL device of Example 2 was evaluated with respect to light-emitting efficiency in the same manner as Example 1. As a result, the organic EL device exhibited a light-emitting efficiency of 1.2% when it emits light with a brightness of 200 $cd/m^2$, and the device exhibited a light-emitting efficiency of 3.1% when it emits light with a brightness of 2000 $cd/m^2$.

As described in detail above, the organic thin film device such as the organic EL device excellent in light-emitting efficiency, uniformity of light emission and durability can be produced with excellent efficiency and reduced cost by the method according to the present invention where the organic thin film is provided on the temporary substrate by the wet method, etc. and transferred to the substrate. The transfer material comprising the patterned pixels of blue, green and red on the temporary substrate may be used in the present invention to easily produce the full-color organic EL device with excellent accuracy. The method according to the present invention is also advantageous in that the organic thin film can be remarkably thinned.

What is claimed is:

1. A method for producing an organic thin film device comprising the steps of:
    making an organic thin film of a transfer material face a substrate with a space therebetween, wherein said transfer material comprises said organic thin film and a temporary substrate, with said organic thin film on said temporary substrate;
    decompressing said space between said transfer material and said substrate to bring said transfer material in contact to said substrate;
    heating at least said organic thin film; and
    peeling said temporary substrate from said organic thin film to transfer said organic thin film to said substrate.

2. The method for producing an organic thin film device according to claim 1, wherein said method comprises the steps of: placing a mask having a plurality of openings in a minute pattern between said transfer material and said substrate; decompressing spaces in said openings between said transfer material and said substrate to bring said transfer material in contact to said substrate; heating at least said organic thin film; and peeling said temporary substrate from said organic thin film to transfer said organic thin film to said substrate in said minute pattern.

3. The method for producing an organic thin film device according to claim 2, wherein said openings are tapered from a transfer material side to a substrate side.

4. The method for producing an organic thin film device according to claim 2, wherein said mask has an aperture connected with said openings and said spaces are decompressed through said aperture.

5. The method for producing an organic thin film device according to claim 4, wherein said aperture comprises recesses provided on a bottom of said mask.

6. The method for producing an organic thin film device according to claim 2, wherein said mask is made of a material selected from the group consisting of metals, glasses, ceramics and heat resistant resins.

7. The method for producing an organic thin film device according to claim 2, wherein each of a blue light-emitting organic thin film, a green light-emitting organic thin film and a red light-emitting organic thin film is transferred to said substrate in a minute pattern to provide a light-emitting organic thin film comprising pixels of blue, green and red arranged repeatedly.

8. The method for producing an organic thin film device according to claim 1, wherein said organic thin film device comprises a light-emitting organic thin film or a carrier-transporting organic thin film.

9. The method for producing an organic thin film device according to claim 8, wherein said organic thin film device comprises a hole-transporting organic thin film, a light-emitting organic thin film and an electron-transporting organic thin film disposed in this order from the substrate side.

10. The method for producing an organic thin film device according to claim 8, wherein said light-emitting organic thin film comprises pixels of blue, green and red arranged repeatedly.

11. The method for producing an organic thin film device according to claim 1, wherein said substrate comprises a support and a transparent electrically conductive layer disposed on said support.

12. The method for producing an organic thin film device according to claim 1, wherein said organic thin film is heated at 40 to 200° C.

13. The method for producing an organic thin film device according to claim 1, wherein said organic thin film is provided on said temporary substrate by a wet method.

14. The method for producing an organic thin film device according to claim 1, wherein the transfer material comprises a temporary substrate and a light-emitting organic thin film provided on said temporary substrate, said light-emitting organic thin film comprising patterned pixels of blue, green and red.

15. A method for producing an organic thin film device, wherein a laminate of a plurality of continuous or patterned organic thin films is provided on a substrate by repeating a peeling-transfer process comprising the steps of:
    making an organic thin film of a transfer material face said substrate, with a space therebetween, wherein said transfer material comprises said organic thin film and a temporary substrate, with said organic thin film on said temporary substrate;
    bringing said transfer material in contact to said substrate;
    heating at least said organic thin film; and
    peeling said temporary substrate from said organic thin film to transfer said organic thin film to said substrate.

16. The method for producing an organic thin film device according to claim 15, wherein said transfer material is brought in contact to said substrate while decompressing a space between said transfer material and said substrate.

17. The method for producing an organic thin film device according to claim 15, wherein each of a blue light-emitting organic thin film, a green light-emitting organic thin film and a red light-emitting organic thin film is transferred to said substrate in a minute pattern to provide a light-emitting organic thin film comprising pixels of blue, green and red arranged repeatedly.

18. The method for producing an organic thin film device according to claim 15, wherein said organic thin film device comprises a light-emitting organic thin film or a carrier-transporting organic thin film.

19. The method for producing an organic thin film device according to claim 18, wherein said organic thin film device comprises a hole-transporting organic thin film, a light-emitting organic thin film and an electron-transporting organic thin film disposed in this order from the substrate.

20. The method for producing an organic thin film device according to claim 18, wherein said light-emitting organic thin film comprises pixels of blue, green and red arranged repeatedly.

21. The method for producing an organic thin film device according to claim 15, wherein said substrate comprises a support and a transparent electrically conductive layer disposed on said support.

22. The method for producing an organic thin film device according to claim 15, wherein said organic thin film is heated at 40 to 200° C.

23. The method for producing an organic thin film device according to claim 15, wherein said organic thin film is provided on said temporary substrate by a wet method.

24. The method for producing an organic thin film device according to claim 15, wherein the transfer material comprises a temporary substrate and a light-emitting organic thin film provided on said temporary substrate, said light-emitting organic thin film comprising patterned pixels of blue, green and red.

25. A method for producing an organic thin film device comprising the steps of:
making a light-emitting organic thin film comprising patterned pixels of blue, green and red of a transfer material face a substrate with a space therebetween, wherein said transfer material comprises said light-emitting organic thin film and a temporary substrate, with said organic thin film on said temporary substrate;
bringing said transfer material in contact to said substrate;
heating at least said light-emitting organic thin film; and
peeling said temporary substrate from said light-emitting organic thin film to transfer said light-emitting organic thin film to said substrate.

26. The method for producing an organic thin film device according to claim 25, wherein said transfer material is brought in contact to said substrate while decompressing a space between said transfer material and said substrate.

27. The method for producing an organic thin film device according to claim 25, wherein said organic thin film device comprises a hole-transporting organic thin film, said light-emitting organic thin film and an electron-transporting organic thin film disposed in this order from the substrate side.

28. The method for producing an organic thin film device according to claim 25, wherein said substrate comprises a support and a transparent electrically conductive layer disposed on said support.

29. The method for producing an organic thin film device according to claim 25, wherein said light-emitting organic thin film is heated at 40 to 200° C.

30. The method for producing an organic thin film device according to claim 25, wherein said light-emitting organic thin film is provided on said temporary substrate by a wet method.

31. The method for producing an organic thin film device according to claim 25, wherein the transfer material comprises a temporary substrate and a light-emitting organic thin film provided on said temporary substrate, said light-emitting organic thin film comprising patterned pixels of blue, green and red.

32. A method for producing an organic thin film device comprising the steps of: decompressing a space between a transfer material having said organic thin film on a temporary substrate and a substrate to bring said transfer material in contact to said substrate; heating at least said organic thin film; and peeling said temporary substrate from said organic thin film to transfer said organic thin film to said substrate.

33. The method for producing an organic thin film device according to claim 32, wherein said method comprises the steps of: placing a mask having a plurality of openings in a minute pattern between said transfer material and said substrate; decompressing spaces in said openings between said transfer material and said substrate to bring said transfer material in contact to said substrate; heating at least said organic thin film; and peeling said temporary substrate from said organic thin film to transfer said organic thin film to said substrate in said minute pattern.

34. The method for producing an organic thin film device according to claim 33, wherein said openings are tapered from a transfer material aide to a substrate side.

35. The method for producing an organic thin film device according to claim 33, wherein said mask has an aperture connected with said openings and said spaces are decompressed through said aperture.

36. The method for producing an organic thin film device according to claim 35, wherein said aperture comprises recesses provided on a bottom of said mask.

37. The method for producing an organic thin film device according to claim 33, wherein said mask is made of a material selected from the group consisting of metals, glasses, ceramics and heat resistant resins.

38. The method for producing an organic thin film device according to claim 33, wherein each of a blue light-emitting organic thin film, a green light-emitting organic thin film and a red light-emitting organic thin film is transferred to said substrate in a minute pattern to provide a light-emitting organic thin film comprising pixels of blue, green and red arranged repeatedly.

39. The method for producing an organic thin film device according to claim 32, wherein said organic thin film device comprises a light-emitting organic thin film or a carrier-transporting organic thin film.

40. The method for producing an organic thin film device according to claim 39, wherein said organic thin film device comprises a hole-transporting organic thin film, a light-emitting organic thin film and an electron-transporting organic thin film disposed in this order from the substrate.

41. The method for producing an organic thin film device according to claim 39, wherein said light-emitting organic thin film comprises pixels of blue, green and red arranged repeatedly.

42. The method for producing an organic thin film device according to claim 32, wherein said substrate comprises a support and a transparent electrically conductive layer disposed on said support.

43. The method for producing an organic thin film device according to claim 32, wherein said organic thin film is heated at 40 to 200° C.

44. The method for producing an organic thin film device according to claim 32, wherein said organic thin film is provided on said temporary substrate by a wet method.

45. A method for producing an organic thin film device, wherein a laminate of a plurality of continuous or patterned organic thin films is provided on a substrate by repeating a peeling-transfer process comprising the steps of: bringing a transfer material having said organic thin film on a temporary substrate in contact to a substrate; heating at least said organic thin film; and peeling said temporary substrate from said organic thin film to transfer said organic thin film to said substrate.

46. The method for producing an organic thin film device according to claim 45, wherein said transfer material is brought in contact to said substrate while decompressing a space between said transfer material and said substrate.

47. The method for producing an organic thin film device according to claim 45, wherein each of a blue light-emitting organic thin film, a green light-emitting organic thin film and a red light-emitting organic thin film is transferred to said substrate in a minute pattern to provide a light-emitting organic thin film comprising pixels of blue, green and red arranged repeatedly.

48. The method for producing an organic thin film device according to claim 45, wherein said organic thin film device comprises a light-emitting organic thin film or a carrier-transporting organic thin film.

49. The method for producing an organic thin film device according to claim 48, wherein said organic thin film device comprises a hole-transporting organic thin film, a light-emitting organic thin film and an electron-transporting organic thin film disposed in this order from the substrate.

50. The method for producing an organic thin film device according to claim 48, wherein said light-emitting organic thin film comprises pixels of blue, green and red arranged repeatedly.

51. The method for producing an organic thin film device according to claim 45, wherein said substrate comprises a support and a transparent electrically conductive layer disposed on said support.

52. The method for producing an organic thin film device according to claim 45, wherein said organic thin film is heated at 40 to 200° C.

53. The method for producing an organic thin film device according to claim 45, wherein said organic thin film is provided on said temporary substrate by a wet method.

54. A method for producing an organic thin film device comprising the steps of: bringing a transfer material having a light-emitting organic thin film on a temporary substrate in contact to a substrate; said light-emitting organic thin film comprising patterned pixels of blue, green and red of a transfer material which faces the substrate; heating at least said light-emitting organic thin film and peeling said temporary substrate from said light-emitting organic thin film to transfer said light-emitting organic thin film to said substrate.

55. The method for producing an organic thin film device according to claim 54, wherein said transfer material is brought in contact to said substrate while decompressing a space between said transfer material and said substrate.

56. The method for producing an organic thin film device according to claim 54, wherein said organic thin film device comprises a hole-transporting organic thin film, said light-emitting organic thin film and an electron-transporting organic thin film disposed in this order from the substrate aids.

57. The method for producing an organic thin film device according to claim 54, wherein said substrate comprises a support and a transparent electrically conductive layer disposed on said support.

58. The method for producing an organic thin film device according to claim 54, wherein said light-emitting organic thin film is heated at 40 to 200° C.

59. The method for producing an organic thin film device according to claim 54, wherein said light-emitting organic thin film is provided on said temporary substrate by a wet method.

* * * * *